United States Patent
Yun et al.

(10) Patent No.: US 11,507,025 B2
(45) Date of Patent: Nov. 22, 2022

(54) DOUBLE-MODULATION CPT DIFFERENTIAL DETECTION METHOD AND SYSTEM

(71) Applicant: National Time Service Center (NTSC), Chinese Academy of Science (CAS), Xi'an (CN)

(72) Inventors: Enxue Yun, Xi'an (CN); Qinglin Li, Xi'an (CN); Qiang Hao, Xi'an (CN); Guobin Liu, Xi'an (CN); Yuping Gao, Xi'an (CN); Shougang Zhang, Xi'an (CN)

(73) Assignee: National Time Service Center (NTSC), Chinese Academy of Science (CAS), Xi'an (CN)

( * ) Notice: Subject to any disclaimer, the term of this patent is extended or adjusted under 35 U.S.C. 154(b) by 0 days.

(21) Appl. No.: 17/220,324

(22) Filed: Apr. 1, 2021

(65) Prior Publication Data
US 2022/0171343 A1    Jun. 2, 2022

(30) Foreign Application Priority Data
Oct. 28, 2020    (CN) .......................... 202011168758.8

(51) Int. Cl.
*G04F 5/14* (2006.01)
*H03L 7/26* (2006.01)

(52) U.S. Cl.
CPC ................ *G04F 5/145* (2013.01); *H03L 7/26* (2013.01)

(58) Field of Classification Search
CPC .............. G04F 5/145; G04F 5/14; H03L 7/26
See application file for complete search history.

(56) References Cited

U.S. PATENT DOCUMENTS

| 2009/0289728 A1* | 11/2009 | Ben-Aroya | G04F 5/145 331/94.1 |
| 2018/0101139 A1* | 4/2018 | Larsen | H05H 3/02 |
| 2018/0321641 A1* | 11/2018 | Boyd | H01S 3/08086 |

OTHER PUBLICATIONS

Yun, Peter, et al. "Constructive polarization modulation for coherent population trapping clock." Applied physics letters 105.23 (2014): 231106. (Year: 2014).*

* cited by examiner

*Primary Examiner* — Ryan Johnson
(74) *Attorney, Agent, or Firm* — Westbridge IP LLC

(57) ABSTRACT

The invention relates to a differential detection of double-modulation (DM) CPT method and a system for implementing the method of this invention. The method comprises the following steps: Generating a coherent bichromatic light, in which the polarization and the relative phase are synchronously modulated. The DM light interacts with a quantum resonance system and prepares it into a CPT state. Then the polarization of coherent bichromatic light is switched from circular polarization to linear polarization. After interacting with the CPT state prepared in the previous stage, the constructive and destructive quantum interference occur simultaneously. The polarization of the transmitted light from the quantum resonance system is converted and spatially separated. Then two CPT signals, detected by balanced photodetectors, are observed with constructive and destructive interference respectively. Finally, a differential CPT signal with high signal-to-noise ratio is obtained by subtracting the above-mentioned two CPT signals.

5 Claims, 6 Drawing Sheets

DOUBLE-MODULATION CPT DIFFERENTIAL DETECTION METHOD AND SYSTEM

CROSS REFERENCES OF RELATED APPLICATIONS

The present application claims the priority of the Chinese patent application No. CN202011168758.8 filed on Oct. 28, 2020. The contents of the above identified applications are incorporated herein by reference in their entireties.

FIELD

The present invention relates generally to the field of atomic clocks, atomic magnetometers, atomic spectroscopy, and specifically to a CPT differential detection technique.

BACKGROUND

Coherent Population Trapping (CPT) is a quantum interference effect. Owing to the advantage of microwave cavity free, the passive CPT configuration is used for implementing compact and chip-scale atomic clocks and atomic magnetometers. The passive CPT based atomic clock and sensor is an ideal choice for applications such as deep space exploration, unmanned aerial vehicles, urban and underground rescue, underwater submarines, surveying and the like, and is also a key unit device in micro-technology based positioning, navigation, and timing system (μPNT).

Taking the passive CPT atomic clock (herein and after denoted as CPT clock) as an example, which usually uses a circularly polarized bichromatic light (e.g. left circular $\sigma^+\sigma^+$) to pump the atoms into a CPT state, saying that when the frequency difference of the bichromatic light is equal to the hyperfine energy level splitting of the alkali metal atom ground state, a quantum interference effect occurs, and the atoms do not absorb the incident light any more, thus the transmitted light intensity increases. When the frequency difference of the bichromatic light is scanned, a narrow linewidth CPT signal can be obtained. The CPT signal is used as a frequency discrimination signal for a local oscillator. When the local oscillator is locked to the CPT resonance, an atomic clock is realized.

On the one hand, in compact and chip-scale CPT clock configurations, a single circularly polarized bichromatic light is usually adopted to interact with an atomic ensemble and pump atoms into polarization dark state, i.e., the extreme ($|m_F|=F$) Zeeman sublevels, wherein: mF is the magnetic quantum number, and F is the total quantum number, thus leading to a low contrast of the clock transition ($|^2S_{1/2}, F, m_F=0\rangle \rightarrow |^2S_{1/2}, F', m'_F=0\rangle$, abbreviated as $|m_F=0\rangle \rightarrow |m'_F=0\rangle$), typically around only 1%-5%. The contrast is defined here as C=A/B, where A, B are the amplitude and background of the CPT signal, respectively. The short-term frequency stability of the atomic clock is given approximately by: $\sigma_y(\tau) \approx \sqrt{RIN/2}(4q\, v_{hf})^{-1}\tau^{-1/2}$, wherein RIN, q, vhf are laser relative intensity noise, quality factor and clock transition frequency, respectively, and the quality factor q is defined as: $q=C/\Delta$, where $\Delta$ is the linewidth of the CPT signal. It shows that the atomic clock frequency stability is inversely proportional to the CPT signal contrast for a given linewidth. Therefore, the low contrast CPT signal becomes a main limiting factor for improving the performance of the compact CPT clock, which is also the case for the chip-scale CPT clock (with a typical short-term frequency stability of 1~3 E-10 at 1 second).

On the other hand, in the developing high-performance CPT atomic clock, in order to obtain high contrast, a relatively complex optical path configuration is generally used, increasing the clock's volume greatly, thus sacrificing the main advantages of the CPT atomic clock, namely the capability of miniaturization. Meanwhile, due to the fact that large common-mode noise exists in the bichromatic optical configuration and the detection mode used by the typical CPT clock, such as laser amplitude noise (AM), laser frequency noise to amplitude noise through absorption spectral lines (FM-AM), microwave power noise and the like, thus it is very difficult to further improve the frequency stability of the CPT clock.

For example, a double-modulation CPT (DM CPT) configuration uses a mode of synchronously modulating the relative phase and polarization of coherent bichromatic light, so that a CPT signal with maximum clock transition contrast up to about 10% can be obtained, and it also maintains the advantage of miniaturization. However, due to the detection of light intensity transmitted from the atom ensemble, which has large background, laser AM noise, laser FM-AM noise, as well as microwave power noise, thus it sets limits on the frequency stability of the DM CPT atomic clock.

SUMMARY

In order to overcome the defects of low CPT signal contrast and large common-mode noise in the prior art, the invention discloses a double-modulation CPT differential detection method, which has the advantages of compact structure, high contrast and low common-mode noise.

The method used by the invention for solving the technical problems is a double-modulation CPT differential detection method comprises the following steps:
1) Phase modulation. Providing a coherent bichromatic light, wherein the relative phase between the two frequency components of the bichromatic light is switched between $\phi+0$ and $\phi+\pi$ as requested, wherein $\phi$ is an initial arbitrary phase.
2) Polarization modulation. The polarization of coherent bichromatic light is switched among left circular polarization, right circular polarization and linear polarization according to a set rule.
3) DM CPT stage. The double modulation coherent bichromatic light, in which the phase modulation mentioned in step 1) and the polarization modulation between left and right circular polarization are implemented synchronously, interacts with a quantum resonance system, forms the DM CPT and prepares the quantum resonance system into a CPT state with maximum clock transition amplitude.
4) Linear polarization light-atom interaction stage. After DM CPT stage, the polarization of coherent bichromatic light is switched from circular polarization to linear polarization, which can be decomposed to the left and right circular polarization components. Both components interact with the CPT state prepared in the previous stage simultaneously, and constructive and destructive quantum interference effects occur respectively.
5) Polarization conversion and separation. The polarization of the transmitted light from the quantum resonance system is transformed, in which the linear polarization is converted into left or right circular polarization. Then the coherent bichromatic light is spatially separated into mutual orthogonally and linearly polarized bichromatic light. Detected with two balanced photodetectors, CPT signals are observed with constructive and destructive interference respectively.

6) Differential signal. Subtracting the CPT signals of the constructive and the destructive interference observed in 5), a differential CPT signal with high signal-to-noise ratio is obtained.

The light-atom interaction is implemented by a continuous wave laser or pulse laser.

Specifically, for a pulse laser to implement the differential detection of double-modulation coherent population trapping, a no-light period is added after the time sequence of DM CPT stage of step 3) to enable a quantum resonance system to evolve freely, then followed by a detection pulse with linearly polarized coherent bichromatic light to interact with the quantum resonance system, and performed the steps 4) to 6), a Ramsey-CPT signal with differential shape is observed.

The length of no-light period is at the same order of the ground states coherence time, for maximizing the contrast of CPT signal.

In this method, the clock transition of differential CPT signal is applied to a CPT atomic clock, the non-clock transition of differential CPT signal is applied to an atomic magnetometer, and both the clock and the non-clock transition of differential CPT signals can be applied to atomic precision spectroscopy.

The invention also discloses a double-modulation CPT differential detection system for realizing the method, which comprises a direct current source, a coupler (bias-tee), a phase modulator, a microwave signal source, a laser, a half wave plate, a polarization modulator, a quarter wave plate, a quantum resonance system, a second quarter-wave plate, a second half-wave plate, a polarization beam splitter and a subtractor.

The direct current source supplies power to the laser diode through the microwave coupler; the microwave signal source, which is phase modulated through a phase modulator, is coupled to the laser diode by the microwave coupler. Then a coherent bichromatic light is formed in the multi-colored output of the laser diode. After passing through a half-wave plate and a polarization modulator, a DM coherent bichromatic light is generated. Then it sequentially passes through a quarter-wave plate, a quantum resonance system, a second quarter-wave plate, a second half-wave plate and a polarization beam splitter. After that, the coherent bichromatic light is spatially separated to mutually orthogonally and linearly polarized light, and then detected with two balanced photodetectors to obtain CPT signals with constructive and the destructive interference respectively. Finally, a differential CPT signals is obtained by subtracting the above-mentioned two CPT signals.

The quantum resonance system comprises a CPT resonance energy level structure from two ground states to the same excited state, and adapts to hydrogen atoms (H), alkali metals (Li, Na, K, Rb, Cs), Hg+, Ca+, Yb+, Ba+ or C-60 particles.

The particles are in a gaseous hot atom, gaseous cold atom, gaseous atomic beam, ion, molecular or plasma state.

The quantum resonance system adopts an active CPT or passive CPT configuration.

The invention has the beneficial effects that:
1. By combining a double-modulation (DM CPT) with constructive and the destructive interference detection technique, electromagnetic induction transparency (EIT) and electromagnetic induction absorption (EIA) signals can be obtained by controlling the relative phase and polarization of coherent bichromatic light.
2. By combining DM CPT with a differential detection technique, the signal contrast is improved by more than one order of magnitude.
3. Through differential detection of CPT, common-mode noise such as laser amplitude noise (AM), laser frequency noise to amplitude noise through absorption spectral lines (FM-AM), microwave power noise and the like, is effectively suppressed.
4. Compact structure and potential of miniaturization. The polarization modulator can be realized by a liquid crystal polarization rotator with extremely small volume and power consumption, thus can be applied to a chip-scale CPT atomic clock with improved frequency stability.

Figure 1:
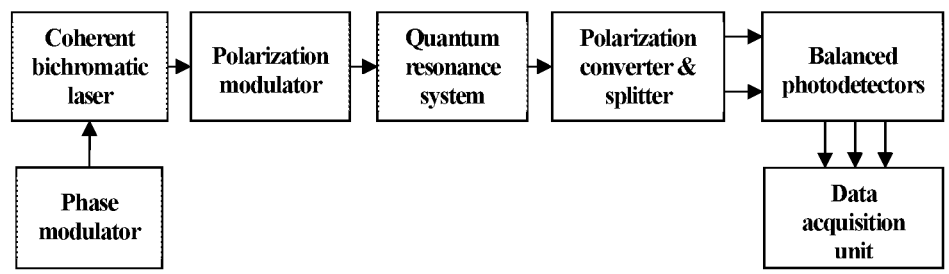
FIG. 1 is a schematic diagram of the principle of the present invention.
Figure 2:
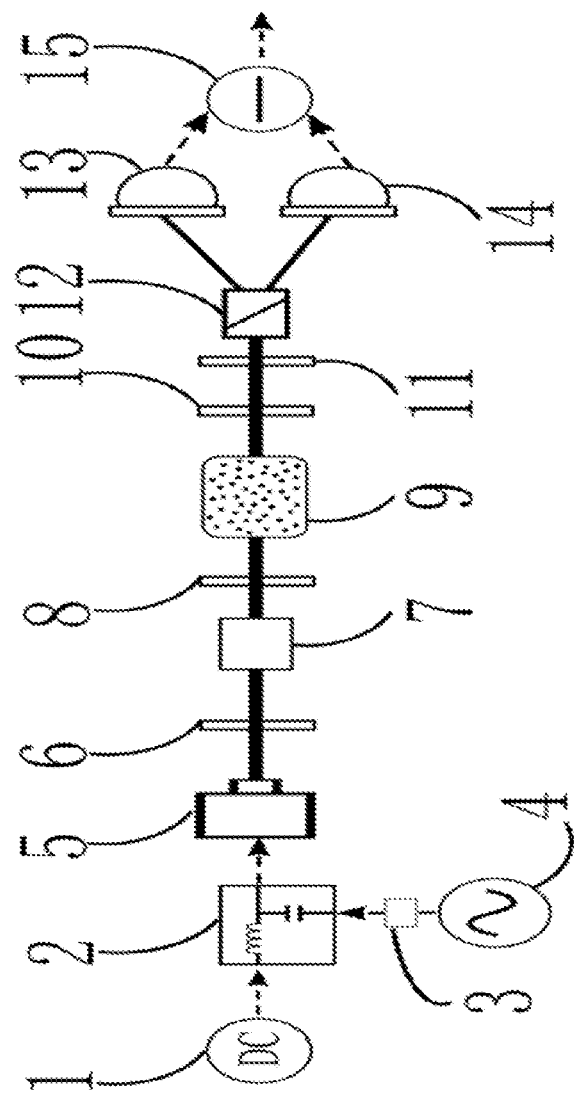
FIG. 2 is a schematic view of the system of the present invention.

In the FIG. 2, 1—a direct current source; 2—a microwave coupler (bias-tee); 3—a phase modulator; 4—a microwave signal source for generating a coherent bichromatic light; 5—a high modulation bandwidth (>GHz) laser diode; 6—a half wave plate ($\lambda/2$); 7—a polarization modulator; 8—a quarter wave plate ($\lambda/4$); 9—a quantum resonance systems; 10—a second quarter wave plate ($\lambda/4$); 11—a second half wave plate ($\lambda/2$); 12—a polarizing beam splitter; 13—balanced photodetector 1; 14—balanced photodetector 2; 15—an electronic subtractor.

DETAILED DESCRIPTION

The present invention will be further described with reference to the accompanying drawings and embodiments, which include, but are not limited to, the following embodiments.

CPT is a quantum interference effect. In the field of atomic clocks application, include both active CPT and passive CPT. The quantum resonance system comprises a CPT resonance energy level structure from two ground states to the same excited state, and applies to hydrogen atoms (H), alkali metals (Li, Na, K, Rb, Cs), Hg$^+$, Ca$^+$, Yb$^+$, Ba$^+$ or fullerene (C-60) particles, the particles being in a gaseous hot atom, gaseous cold atom, gaseous atomic beam, ion, molecular or plasma state. The invention takes the passive CPT based vapor cell atomic clock, in which a continuous laser interacts with $^{87}$Rb atom ensemble, as an example to describe the specific implementation mode of the invention. But the present invention is not limited thereto, and the applicable scope covers all the configurations described above.

The coherent bichromatic light source can be obtained by means of frequency locking of two independent lasers, external modulation (such as EOM, AOM and the like), internal modulation (direct-modulated lasers) and the like, wherein the microwave frequency used for the modulation is $v_{hf}/n$, $v_{hf}$ for the clock transition frequency, n for a positive integer. The invention takes the half-wave modulation for example, in which the coherent bichromatic light is generated by the direct modulation of a high modulation bandwidth laser diode with microwave frequency around $v_{hf}/2$.

The implementation of the invention comprises a coherent bichromatic light source, a phase modulator, a polarization modulator, a quantum resonance system, a polarization conversion and beam splitter, balanced photodetectors and a data acquisition unit.

The double-modulation CPT differential detection method of this invention comprises the following steps:
1) Double-modulation CPT stage. Through a phase modulator and a polarization modulator, firstly generating coherent bichromatic light with synchronously modulated polarization and phase, forming the DM light. Then the DM light interacts with a quantum resonance system and prepares it into a CPT state with the maximum clock transition amplitude.
2) Linear polarization light-atom interaction stage. The linearly polarized bichromatic light, which can be decomposed to the left and right circular polarization components, interacts with the CPT state prepared in the previous stage, and constructive and destructive quantum interference occur respectively.
3) Differential detection of CPT signal. The polarization of transmitted light after quantum resonance system is converted and spatially separated by the polarization converter & splitter module. Then detected by two balanced photodetectors, an electromagnetic induction transparent (EIT) signal with constructive interference and an electromagnetic induction absorption (EIA) signal with destructive interference are observed respectively, and finally a differential CPT signal is obtained by subtracting the forementioned two CPT signals.

In the invention, the phase modulator dynamically controls the relative phase of the two frequency components of bichromatic light in order to implement the in-phase and out-phase modulation. This can be realized by a phase shifter, a direct digital frequency synthesizer (DDS) or a phase-locked loop (PLL).

The polarization modulator dynamically controls the polarization direction of coherent bichromatic light among left circular polarization, right circular polarization and linear polarization. The polarization modulator is realized by liquid crystal polarization rotator or electro-optic modulator (EOM).

The polarization conversion & splitter converts the linear polarization into left or right circular polarization, and spatially separated the coherent bichromatic light into mutual orthogonally and linearly polarized light. The component comprises a quarter wave plate ($\lambda/4$), a half wave plate ($\lambda/2$), a polarization beam splitter, wherein the polarization beam splitter adopts polarizing beam splitting prism, Wollaston Prism or Glan-Taylor Prism.

When the light-atom interaction is illuminated by a continuous laser, it forms the so-called CW CPT.

The light source can also be a pulse laser, which form the differential detection of Ramsey-CPT. In this situation, a no-light period is added after a time sequence of DM CPT stage to enable the quantum resonance system to evolve freely, then followed by a detection pulse with linearly polarized coherent bichromatic light to interact with the quantum resonance system, and performed the polarization conversion, beams separation and balanced detection, a Ramsey-CPT signal with differential shape, narrower linewidth and higher signal-to-noise ratio is then observed.

The obtained high contrast differential CPT signal of clock transition, $|m_F=0\rangle \rightarrow |m'_F=0\rangle$, can be applied to a CPT atomic clock to realize a high performance atomic clock. And the high contrast differential CPT signal of non-clock transition, $|m_F\neq 0\rangle \rightarrow |m'_F\neq 0\rangle$, can be applied to an atomic magnetometer with improved sensitivity. What's more, all the high contrast differential CPT signal obtained by the method can be used to determine accurately the resonance frequency and the transition amplitude of the quantum resonance system, thus it suits for the field of precision spectroscopy.

As shown in FIG. 2, an embodiment of the present invention discloses a physical package system for differential detection of DM CPT.

In the system, a direct current source 1 drives a laser diode system 5 and tunes its output light wavelength to a proper position of atomic resonance. A microwave signal source 4 is coupled to the laser diode through a coupler 2 and modulates its output light frequency. Then a multicolor light is generated by the laser diode 5, the ±1st order sidebands form the desired coherent bichromatic light which is used for CPT states preparation and detection, while other frequency components do not interact with an atomic system obviously and exist only as the detection background.

The phase modulator 3 implements phase modulation on the microwave signal source 4, i.e., switches phase between $\varphi+0$ and $\varphi+\pi/2$ according to design rule, where $\varphi$ is the initial arbitrary phase. Correspondingly, the relative phase of the coherent bichromatic light is switched between $\phi+0$ and $\phi+\pi$, where $\phi$ is the initial arbitrary phase. The coherent bichromatic light passes through in sequence the first $\lambda/2$ wave plate 6, the polarization modulator 7 and the first $\lambda/4$ wave plate 8, thus the polarization of the coherent bichromatic light can be switched among left circular polarization, right circular polarization or linear polarization as requested.

Figure 3:
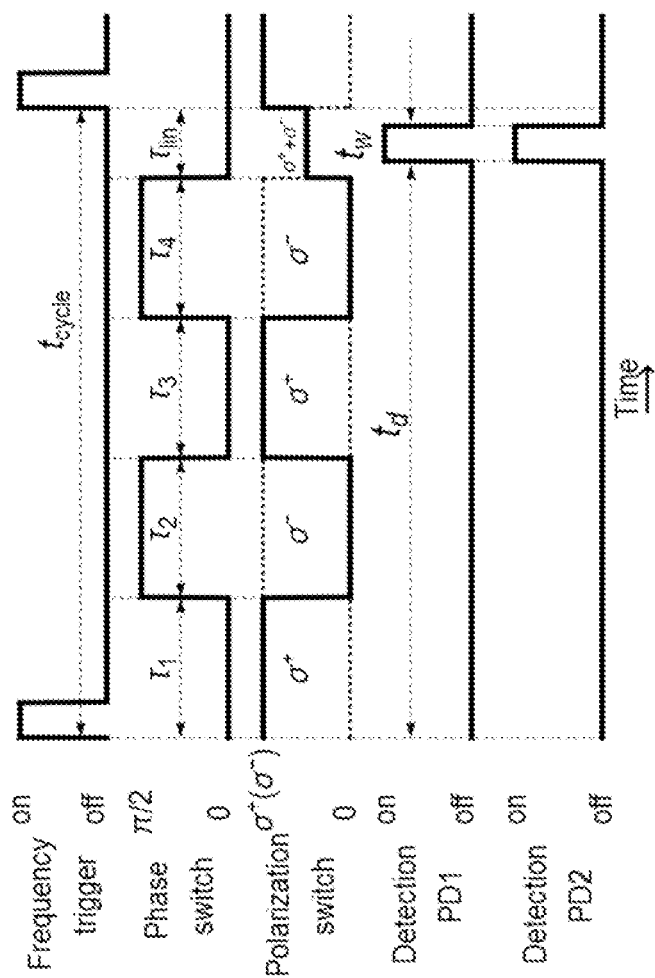
FIG. 3 is a timing diagram illustrating the operation of the present invention, wherein the period numbers of double-modulation is only for illustration.
Figure 4:
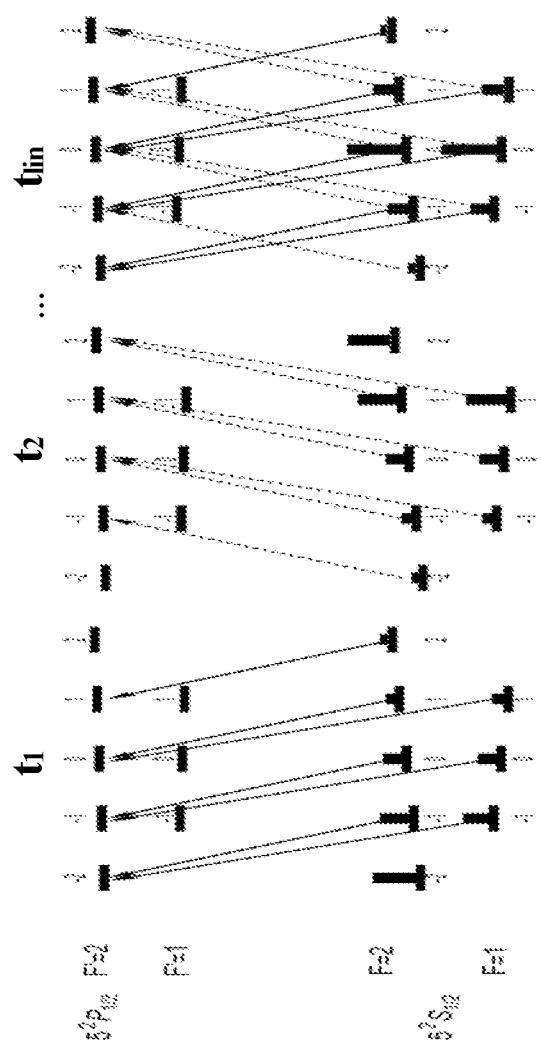
FIG. 4 is a schematic diagram, illustrating the bichromatic light polarization and atomic population distribution at various moments, where $t_1$, $t_2$, $t_{lin}$ respectively at a certain moment just before the end of the first left-handed pulse, the first right-handed pulse and the linear polarization pulse.
Figure 5:
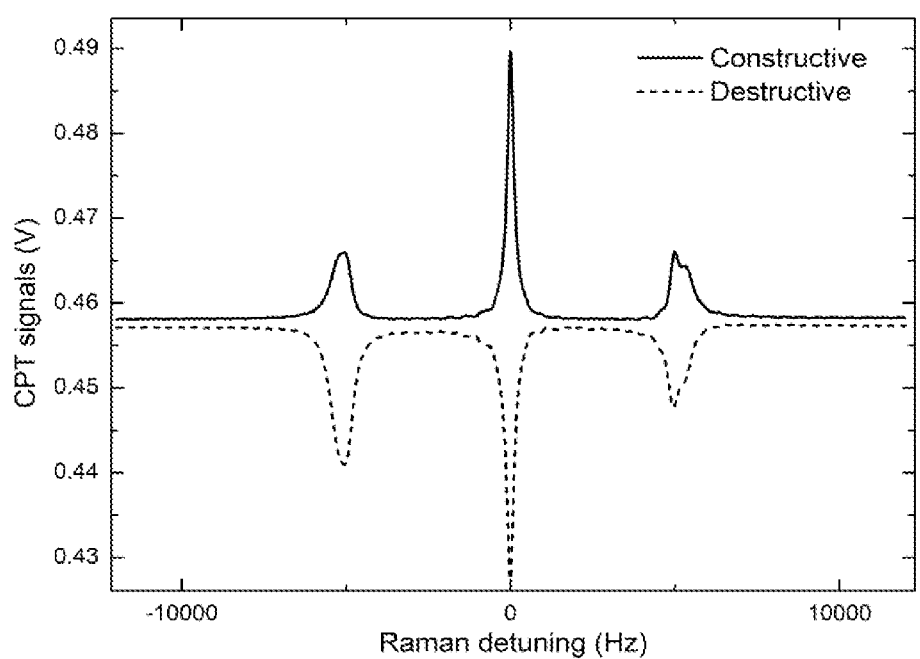
FIG. 5 is a schematic diagram of typical electromagnetic induced transparency (EIT) and electromagnetic induced absorption (EIA) signals obtained by the present invention.
Figure 6:
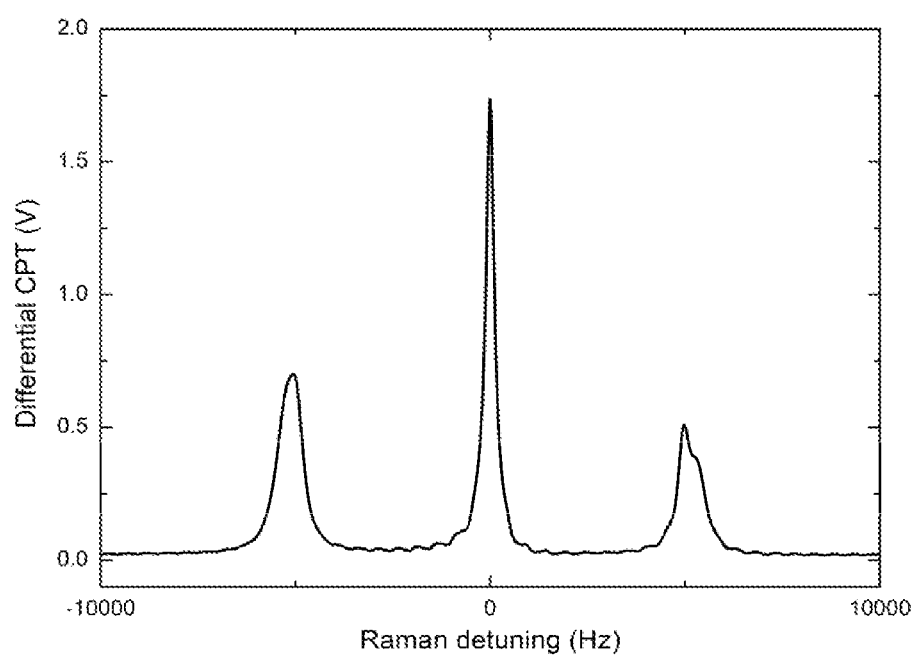
FIG. 6 is a schematic diagram of a typical differential CPT signal obtained by the present invention.

As shown in FIG. 3, there are two stages in the time sequence of each periods in order to control the interaction of light and quantum resonance system 9 with different polarizations and phases.

The first stage is double-modulation CPT, in which the polarization of coherent bichromatic light is switch between left and right circular polarization, and the relative phase is synchronously switched from $\phi+0$ and $\phi+\pi$. After a proper light-atom interaction time, the quantum resonance system is prepared into a CPT state with the maximum clock transition amplitude. This stage corresponds to $\tau_1, \tau_2, \tau_3, \tau_4$ in FIG. 3, wherein only two periods of alternate circular polarization is plotted for demonstration. The duration of the left and right circular polarization is in the range of microsecond to millisecond for maximizing the population of clock states, and can be equal ($\tau_1=\tau_2=\tau_3=\tau_4$), or unequal ($\tau_1\neq\tau_2\neq\tau_3\neq\tau_4$).

The second stage is linear polarization light-atom interaction: the polarization of the coherent bichromatic light is switched from circular polarization to linear polarization, and this stage corresponds to $\tau_{lin}$ in FIG. 3, the duration of the linear polarization is 10 μs~10 ms for maximizing the contrast of CPT signal. The component of left- and right-handed circular polarization in the linear light interacts with the quantum resonance system simultaneously, and generates the constructive and destructive quantum interference respectively with the CPT state prepared in the previous stage. The transmitted light from the atom ensemble passes through the second λ/4 wave plate 10 to convert the polarization into the same state before the first λ/4 wave plate 8, and then passes through the second λ/2 wave plate 11 and the polarization beam splitter 12 to spatially separate the transmitted light into orthogonally and linearly polarized bichromatic light. The constructive and destructive interference CPT signals are detected by two balanced photodetectors 13 and 14, respectively. Finally, the differential CPT signal is generated with an electronic subtractor 15.

To solve the problem of low CPT contrast caused by the polarization dark state, the invention adopts the DM CPT configuration to increase the CPT contrast of the clock transition. In this method, atom population is pumped alternately by the left and right circularly polarized bichromatic light to eliminate the polarized dark state, and simultaneously implement the phase modulation synchronous with the polarization, wherein the phase modulation is realized by the phase modulator 3, so that the CPT states prepared by the left and right circularly polarized bichromatic light respectively are constructive with each other, and finally a CPT signal of clock transition with high contrast is obtained.

The present invention further adopts differential detection to eliminate the background of CPT signal, so that the CPT contrast is improved by one order of magnitude at least, meanwhile, the common-mode noises such as laser AM, FM-AM, microwave power and the like are suppressed. In the operation sequence of the present invention as shown in FIG. 3, after several pumping cycles (2 cycles are shown in the figure) of alternating left and right circular polarization, the present invention switches the circular polarization of the incident bichromatic light into linearly polarization. A linearly polarized light can be decomposed into a superposition of left and right circularly polarized bichromatic lights, and notice that the amplitude of each component is reduced to half of the former. Considering that the microwave phase is set to 0 degrees at this time, the interaction of the linearly polarized bichromatic light with the atoms that have been previously prepared to the CPT states can be divided into two parts: One polarization component of the bichromatic light, taking right circularly polarized ($\sigma^+$) bichromatic light for example, it interferes constructively with the already prepared CPT state, i.e., the latter is also the dark state of former. Therefore, the atom ensemble does not absorb light, exhibits enhanced transmission and manifests as electromagnetically induced transparent (EIT). And the other orthogonal polarization component, left circular polarization ($\sigma^-$) bichromatic light, interferes destructively with the prepared CPT state, i.e., the latter is not the former's dark state but a bright state. Therefore, the atom ensemble absorbs light, exhibits enhanced absorption and manifests as electromagnetic induced absorption (EIA). With help of polarization converter & splitter module, and the balanced detectors, a differential CPT signal is finally obtained by subtracting the EIT and EIA shape signals. The differential CPT signal can be used as a frequency discriminator to lock a local oscillator, thus leads to a high-performance and compact CPT atomic clock.

What is claimed is:
1. A differential detection method for double-modulation coherent population trapping (DM CPT), comprising the following steps:

1) providing a coherent bichromatic light, wherein the relative phase between the two frequency components of the bichromatic light is switched between $\phi+0$ and $\phi+\pi$ according to requirements, wherein $\phi$ is an initial arbitrary phase;
2) switching the polarization of coherent bichromatic light among left circular polarization, right circular polarization and linear polarization according to a set rule;
3) generating the double modulation coherent bichromatic light, in which the phase modulation mentioned in step 1) and the polarization modulation between left and right circular polarization are implemented synchronously, interacting with a quantum resonance system, forming the DM CPT and preparing the quantum resonance system into a CPT state with maximum clock transition amplitude;
4) interacting the light-atom system after step 3), the polarization of coherent bichromatic light is switched from circular polarization to linear polarization, which is decomposed to left and right circular polarization components, both components interacting simultaneously with the CPT state prepared in the previous stage, constructive and destructive quantum interference effects occur respectively;
5) transforming the linear polarization of the transmitted light from the quantum resonance system into left or right circular polarization, then spatially separating the coherent bichromatic light into mutual orthogonally and linearly polarized bichromatic light, being detected with two identical photodetectors, CPT signals are observed with constructive and destructive interference respectively;
6) subtracting the CPT signals of the constructive and the destructive interference observed in 5), a differential CPT signal with doubled CPT amplitude and suppressed noise is then obtained.

2. The differential detection method for double-modulation coherent population trapping of claim 1, wherein the quantum resonance system comprises a CPT resonance energy level structure from two ground states to the same excited state, and adapts to hydrogen atoms, alkali metals, Hg+, Ca+, Yb+, Ba+, C-60 particles at a gaseous hot atom, gaseous cold atom, gaseous atomic beam, ion, molecular or plasma state.

3. The differential detection method for double-modulation coherent population trapping of claim 1, wherein the light-atom interaction is implemented by a continuous laser or pulse laser, in which a no-light period is added after the time sequence of DM CPT stage of step 3) to enable a quantum resonance system evolving freely, then followed by a detection pulse with linearly polarized coherent bichromatic light interacting with the quantum resonance system, and perform the steps 4) to 6), a Ramsey-CPT signal with differential shape is observed.

4. The differential detection method for double-modulation coherent population trapping of claim 1, wherein the magnetically insensitive clock transition of differential CPT signal is applied to a CPT atomic clock, and the magnetically sensitive non-clock transition of differential CPT signal is applied to an atomic magnetometer.

5. A differential detection system for double-modulation coherent population trapping for implementing the method of claim 1, comprising a direct current source, a microwave coupler, a phase modulator, a microwave signal source, a laser diode, a half wave plate, a polarization modulator, a quarter wave plate, a quantum resonance system, a second quarter-wave plate, a second half-wave plate, a polarization beam splitter, two balanced photodetectors and a subtractor,
  wherein the direct current source supplies power to the laser diode through the microwave coupler; the microwave signal source is phase modulated through a phase modulator and is coupled to the laser diode by the microwave coupler; the laser diode is configured to generate a multicolor light, wherein the ±1st order sidebands form the desired coherent bichromatic light; a DM coherent bichromatic light is generated after passing through a half-wave plate and a polarization modulator, and it sequentially passes through a quarter-wave plate, a quantum resonance system, a second quarter-wave plate, a second half-wave plate and a polarization beam splitter; the coherent bichromatic light is configured to be spatially separated to mutually orthogonally and linearly polarized bichromatic light, and then detected with two balanced photodetectors to obtain CPT signals with constructive and destructive interference respectively; and a differential CPT signal is obtained by subtracting the above-mentioned two CPT signals.

* * * * *